United States Patent
Nomoto et al.

(10) Patent No.: US 11,961,815 B2
(45) Date of Patent: Apr. 16, 2024

(54) SINTERED MATERIAL, CONNECTION STRUCTURE, COMPOSITE PARTICLE, JOINING COMPOSITION, AND METHOD FOR MANUFACTURING SINTERED MATERIAL

(71) Applicant: SEKISUI CHEMICAL CO., LTD., Osaka (JP)

(72) Inventors: Hiroyuki Nomoto, Osaka (JP); Masao Sasadaira, Shiga (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 208 days.

(21) Appl. No.: 16/485,558

(22) PCT Filed: Feb. 20, 2018

(86) PCT No.: PCT/JP2018/005923
§ 371 (c)(1),
(2) Date: Aug. 13, 2019

(87) PCT Pub. No.: WO2018/151313
PCT Pub. Date: Aug. 23, 2018

(65) Prior Publication Data
US 2020/0001366 A1 Jan. 2, 2020

(30) Foreign Application Priority Data
Feb. 20, 2017 (JP) .................................. 2017-029143

(51) Int. Cl.
*H01L 23/00* (2006.01)
*B22F 1/065* (2022.01)
(Continued)

(52) U.S. Cl.
CPC ................ *H01L 24/27* (2013.01); *B22F 1/10* (2022.01); *B22F 1/18* (2022.01); *B22F 3/1003* (2013.01);
(Continued)

(58) Field of Classification Search
CPC .. B22F 3/10; B22F 3/1003; B22F 3/11–1146; B22F 1/10; B22F 1/18;
(Continued)

(56) References Cited

U.S. PATENT DOCUMENTS

2007/0145585 A1* 6/2007 Jun ........................ H05K 3/323
257/737
2009/0096100 A1 4/2009 Kajiwara et al.
(Continued)

FOREIGN PATENT DOCUMENTS

| CN | 101875158 | 11/2010 |
|---|---|---|
| JP | 2000-241095 | 9/2000 |

(Continued)

OTHER PUBLICATIONS

Nakamura et al., "Porous Electrode Substrate, Membrane/Electrode Assembly Using Same, and Solid Polymer Fuel Cell Using Same" Description Translation (2016) (Year: 2016).*

(Continued)

*Primary Examiner* — John A Hevey
(74) *Attorney, Agent, or Firm* — Wenderoth, Lind & Ponack, L.L.P.

(57) ABSTRACT

A sintered material excellent in thermal stress and bonding strength; a connection structure containing the sintered material; a composition for bonding with which the sintered material can be produced; and a method for producing the sintered material. The sintered material has a base portion, buffer portions, and filling portions. The buffer portions and filling portions are dispersed in the base portion. The base (Continued)

portion is a metal sintered body, each buffer portion is formed from a pore and/or material that is not the same as the sintered body, and each filling portion is formed from particles and/or fibers. The sintered material satisfies A>B. A is the kurtosis of volume distribution of the base portions in a three-dimensional image of the sintered material. B is the kurtosis of volume distribution of the base portions in a three-dimensional image of the sintered material from which the filling portions are removed.

4 Claims, 3 Drawing Sheets

(51) Int. Cl.
*B22F 1/0655* (2022.01)
*B22F 1/10* (2022.01)
*B22F 1/17* (2022.01)
*B22F 1/18* (2022.01)
*B22F 3/10* (2006.01)
*B22F 3/11* (2006.01)

(52) U.S. Cl.
CPC .................. *B22F 3/11* (2013.01); *B22F 1/065* (2022.01); *B22F 1/0655* (2022.01); *B22F 1/17* (2022.01)

(58) Field of Classification Search
CPC .......... B22F 1/065; B22F 1/0655; B22F 1/17; B22F 3/1103; B22F 5/00; B22F 7/062; C22C 1/04–058; C22C 1/08; C22C 1/0416; C22C 1/0425; C22C 1/0483; C22C 1/05; H01L 24/01; H01L 24/26; H01L 24/27; H01L 24/28; H01L 24/29; H01L 24/31; H01L 24/32; H01L 24/80; H01L 24/83; H01L 2224/2732; H01L 2224/27505; H01L 2224/29005; H01L 2224/29201; H01L 2224/29209; H01L 2224/29211; H01L 2224/29213; H01L 2224/29217; H01L 2224/29218; H01L 2224/29238; H01L 2224/29239; H01L 2224/29244; H01L 2224/29247; H01L 2224/29263; H01L 2224/29264; H01L 2224/29294; H01L 2224/29301; H01L 2224/29309; H01L 2224/29311; H01L 2224/29313; H01L 2224/29317; H01L 2224/29318; H01L 2224/29338; H01L 2224/29339; H01L 2224/29344; H01L 2224/29347; H01L 2224/29364; H01L 2224/29386; H01L 2224/29387; H01L 2224/29388; H01L 2224/2939; H01L 2224/29395; H01L 2224/29401; H01L 2224/29409; H01L 2224/29411; H01L 2224/29413; H01L 2224/29416; H01L 2224/29417; H01L 2224/29418; H01L 2224/2942; H01L 2224/29424; H01L 2224/29438; H01L 2224/29439; H01L 2224/29444; H01L 2224/29447; H01L 2224/29455; H01L 2224/29457; H01L 2224/2946; H01L 2224/29463; H01L 2224/29464; H01L 2224/29466; H01L 2224/29469; H01L 2224/29471; H01L 2224/29473; H01L 2224/29476; H01L 2224/29499; H01L 2224/3201; H01L 2224/32225; H01L 2224/32227; H01L 2224/83055; H01L 2224/83075; H01L 2224/83203; H01L 2224/8384; H01L 2924/351; H01L 2924/3511; H01L 2924/3512; H01L 23/10; H01L 23/488; C23C 18/1651; C23C 18/1635; C23C 18/2086; C23C 18/30; C23C 18/40; C23C 18/44

See application file for complete search history.

(56) References Cited

U.S. PATENT DOCUMENTS

| | | | | |
|---|---|---|---|---|
| 2009/0252637 A1* | 10/2009 | Hurley | ...................... | B22F 7/06 419/36 |
| 2010/0270515 A1 | 10/2010 | Yasuda et al. | | |
| 2012/0003465 A1* | 1/2012 | Rittner | .................. | B22F 1/0014 428/323 |
| 2017/0025374 A1* | 1/2017 | Fujiwara | ................... | H01B 1/22 |

FOREIGN PATENT DOCUMENTS

| | | | |
|---|---|---|---|
| JP | 2004-76043 | | 3/2004 |
| JP | 2004076043 A * | 3/2004 | |
| JP | 2011060502 A * | 3/2011 | |
| JP | 2011-77225 | | 4/2011 |
| JP | 2011198674 A * | 10/2011 | ............. H01L 24/29 |
| JP | 2014-96545 | | 5/2014 |
| JP | 2014-170864 | | 9/2014 |
| JP | 2014170864 A * | 9/2014 | |
| JP | 2016210980 A * | 12/2016 | |
| WO | WO-2016072414 A1 * | 5/2016 | .......... H01M 4/8668 |

OTHER PUBLICATIONS

JP-2011198674-A, Sawai. machine translation. (Year: 2011).*
International Search Report dated May 15, 2018 in International (PCT) Application No. PCT/JP2018/005923.
Göbl et al., "Low Temperature sinter technology Die attachment for power electronic applications", Integrated Power Electronics Systems (CIPS), 6th International Conference on IEEE, Mar. 16, 2010, pp. 1-5.
Dietrich, "Trends in automotive power semiconductor packaging", Microelectronics and Reliability, 2013, vol. 53, No. 9, pp. 1681-1686.
Lu et al., "Emerging Lead-free, High-temperature Die-attach Technology Enabled by Low-temperature Sintering of Nanoscale Silver Pastes", Electronic Packaging Technology & High Density Packaging, 2009 ICEPT-HDP, International Conference on IEEE, Aug. 10, 2009, pp. 461-466.
Lu et al., "Low-temperature and Pressureless Sintering Technology for High-performance and High-temperature Interconnection of Semiconductor Devices", Thermal, Mechanical and Multi-Physics Simulation Experiments in Microelectronics and Micro-Systems, Eurosime 2007, International Conference on IEEE, PI, Apr. 1, 2007, pp. 1-5.
Schmitt et al., "Silver sinter paste for SiC bonding with improved mechanical properties", 2017 21st European Microelectronics and Packaging Conference (EMPC) & Exhibition, IMAPS Europe, Sep. 10, 2017, pp. 1-6.
Extended European Search Report dated Jun. 26, 2020 in corresponding European Patent Application No. 18754224.6.
Communication pursuant to Article 94(3) EPC dated Oct. 19, 2022 in European Patent Application No. 18 754 224.6.
"Industrial Sintering Process", Heraeus Materials Technology GmbH & Co. KG, May 30, 2013, pp. 1-8.

* cited by examiner

SINTERED MATERIAL, CONNECTION STRUCTURE, COMPOSITE PARTICLE, JOINING COMPOSITION, AND METHOD FOR MANUFACTURING SINTERED MATERIAL

TECHNICAL FIELD

The present invention relates to a sintered material; a connection structure comprising the sintered material in a connection part; composite particles; a composition for bonding; and a method for producing the sintered material.

BACKGROUND ART

Connection members are conventionally known to be used for fixing a semiconductor element in a non-insulation type semiconductor device (connection structure), which is a power semiconductor device (power device) used for inverters etc. Such a connection member can be formed from, for example, a curable adhesive or a sinterable material, and can be an electrode of a semiconductor device, depending on the type of the material of the bonding member.

For example, Patent Literature 1 and 2 disclose using a sintered material whose porosity is adjusted, as a connection member for fixing a semiconductor element. Heat dissipation and bonding strength can be ensured by using such a sintered material as a connection member for a semiconductor element.

CITATION LIST

Patent Literature

PTL 1: JP2011-077225A
PTL 2: JP2014-096545A

SUMMARY OF INVENTION

Technical Problem

However, when the sintered materials having pores disclosed in, for example, Patent Literature 1 and 2 are used as connection members, the pores have an effect of relieving thermal stress, but are a factor that reduces strength. Thus, as disclosed in Patent Literature 2 (paragraph [0012]), for example, a dense layer having low porosity must be provided separately, which complicates the process of obtaining a connection member. There is also another problem in that the presence of the dense layer having low porosity causes a reduction in the thermal stress relief effect. It is thus difficult for conventional sintered materials used as connection members to achieve both a thermal stress relief effect and bonding strength, and there is still room for improvement in the use of semiconductor devices, which are required to have high-output characteristics.

The present invention has been accomplished in consideration of the above problems. An object of the present invention is to provide a sintered material excellent in both a thermal stress relief effect and bonding strength; a connection structure comprising the sintered material; composite particles; a composition for bonding for producing the sintered material; and a method for producing the sintered material.

Solution to Problem

The present inventors conducted extensive research to achieve the above object, and found that the above object can be achieved by controlling the distribution state of relief portions (e.g., pores) that exhibit a stress relief effect in a sintered material. The present invention has thus been completed.

Specifically, the present invention includes, for example, the inventions described in the following items.

Item 1. A sintered material comprising a base portion, one or more buffer portions, and one or more filling portions,
the base portion being a metal sintered body,
the buffer portions and the filling portions being dispersed in the base portion,
each buffer portion being formed from at least one of a pore and a material that is not the same as that of the sintered body,
each filling portion being formed from at least one of particles and fibers,
the sintered material satisfying the following expression: A>B, where A is the kurtosis of volume distribution of the base portion in a three-dimensional image of the sintered material, and B is the kurtosis of volume distribution of the base portion in a three-dimensional image of the sintered material from which the filling portions are removed.

Item 2. A sintered material comprising a base portion, one or more buffer portions, and one or more filling portions,
the base portion being a metal sintered body,
the buffer portions and the filling portions being dispersed in the base portion,
each buffer portion being formed from at least one of a pore and a material that is not the same as that of the sintered body,
each filling portion being formed from at least one of particles and fibers,
the value of A being 0.2 or more, where A is the kurtosis of volume distribution of the base portion in a three-dimensional image of the sintered material.

Item 3. The sintered material according to Item 1, wherein the value of A−B is 0.1 or more.

Item 4. The sintered material according to any one of Items 1 to 3, wherein the content of the filling portions is 0.01 wt % or more and 10 wt % or less.

Item 5. The sintered material according to any one of Items 1 to 4, wherein the closest distance between the filling portions is 1 µm or more and 10 µm or less.

Item 6. The sintered material according to any one of Items 1 to 5, wherein the base portion is distributed so as to be oriented in a one-dimensional direction.

Item 7. A connection structure comprising the sintered material according to any one of Items 1 to 6 in a connection part.

Item 8. A composite particle for use in forming the filling portions of the sintered material according to any one of Items 1 to 7, the composite particle having a structure in which a colloid catalyst or a sintering accelerator is placed on a base particle, or a structure in which a base particle is coated with a metal portion.

Item 9. A composition for bonding, comprising metal particles, and a composite having a structure in which a colloid catalyst or a sintering accelerator is placed on a base material or a composite having a structure in which a base material is coated with a metal portion,
the following expression being satisfied:
A>B, where A is the kurtosis of volume distribution of a base portion in a three-dimensional image of a sintered material of the composition for bonding, and B is the kurtosis of volume distribution of a base portion in a three-dimensional image of a sintered material of the composition for bonding from which the composite is removed.

Item 10. A composition for bonding, comprising metal particles, and a composite having a structure in which a colloid catalyst or a sintering accelerator is placed on a base material or a composite having a structure in which a base material is coated with a metal portion, the value of A being 0.2 or more, where A is the kurtosis of volume distribution of a base portion in a three-dimensional image of a sintered material of the composition for bonding.

Item 11. A method for producing a sintered material, the method comprising sintering the composition for bonding according to Item 9 or 10.

Advantageous Effects of Invention

The sintered material according to the present invention has both an excellent thermal stress relief effect and excellent bonding strength. Therefore, the sintered material according to the present invention is suitable as a bonding member for bonding, for example, a semiconductor element.

The composite particles according to the present invention can be suitably used as a raw material for obtaining the sintered material, in particular as a raw material used for forming filling portions of the sintered material.

DESCRIPTION OF EMBODIMENTS

Embodiments of the present invention are described in detail below.

Figure 1:
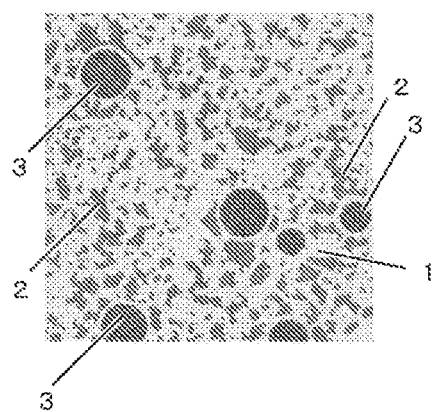
FIG. 1 is a schematic diagram illustrating the cross-section of an embodiment of the sintered material of the present invention.

FIG. 1 is a schematic diagram of a cross-section of the sintered material of the present invention. As used herein, the sintered material means a product, formed by sintering.

The sintered material of the present embodiment comprises a base portion 1, buffer portions 2, and filling portions 3. As shown in FIG. 1, the buffer portions 2 and the filling portions 3 are dispersed in the base portion 1. As a precautionary annotation, the buffer portions 2 and the filling portions 3 may be described as being dispersed in the sintered material.

The base portion 1 is a metal sintered body, and is a portion serving as the base of the sintered material.

The buffer portion 2 is formed from at least one of a pore and a material that is not the same as that of the sintered body. In general, sintered materials have pores. However, the sintered material of the present invention may have pores, or may have pores some or all of which are filled with a material that is not the same as that of the sintered body. The buffer portions 2 present in the sintered material may be formed from only pores. Alternatively, the buffer portions 2 present in the sintered. material may be formed from only a material that is not the same as that of the sintered body. The sintered material may also have both buffer portions 2 formed from pores, and buffer portions 2 formed from a material that is not the same as that of the sintered body.

The multiple buffer portions 2 are formed in the sintered material. The multiple buffer portions 2 may be individually present independently without agglomeration, or may be present in a state in which some or all of the multiple buffer portions 2 are connected to (communicate with) each other in the sintered material.

The filling portion 3 is formed from at least one of particles and fibers. The multiple filling portions 3 are formed in the sintered material. In an embodiment, some of the multiple filling portions 3 are formed from particles, and the others may be formed from fibers.

The multiple filling portions 3 may be individually interspersed independently without agglomeration in the sintered material, or may be present in a state in which some of the filling portions 3 agglomerate. In terms of easily dispersing the buffer portions 2, the filling portions 3 are preferably dispersed uniformly without agglomeration in the sintered material.

The filling portions 3 are present so that a part or all of the surface thereof is in contact with the base portion 1 (sintered body). The filling portions 3 can be in contact with the base portion 1 (sintered body) through, for example, chemical bonding. The type of such chemical bonding is not limited. For example, when the particles and/or fibers forming the filling portions 3 contain a metal on the surface of the filling portions 3 as described later, the chemical bonding can be metallic bonding. In this case, the metal and the metal constituting the base portion 1 may form a solid solution. The filling portions 3 can thereby be easily dispersed uniformly without agglomeration in the sintered material.

The sintered material of the present invention may have a structure such as that shown in FIG. 1. In particular, the sintered material of the present invention can be categorized into two embodiments described later. Hereinafter, the sintered materials according to the two embodiments are individually referred to as a first embodiment and a second embodiment.

The sintered material of the first embodiment satisfies the following expression: A>B, where A is the kurtosis of the volume distribution of the base portion 1 in a three-dimensional image of the sintered material, and B is the kurtosis of the volume distribution of the base portion 1 in a three-dimensional image of the sintered material from which the filling portions 3 are removed.

In the sintered material of the second embodiment, the value of A is 0.2 or more, where A is the kurtosis of the volume distribution of the base portion 1 in a three-dimensional image of the sintered material.

The three-dimensional image of the sintered material can be obtained in such a manner that cross-sections of the sintered material are observed with a scanning electron microscope (SEM), and analyzed using commercially available three-dimensional image analysis software. In the observation of the cross-sections of the sintered material, the sintered material is cut at multiple sites, and each cross-section is observed with a scanning electron microscope (SEM). The sintered material is cut at fine intervals. Specifically, the spacing of the cuts is suitably set according to the sizes of the buffer portions 2 and the filling portions 3 in the sintered material. The smaller the spacing, the more accurate the three-dimensional image obtained. The spacing is preferably 400 nm or less, and more preferably 200 nm or less. In a specific method of obtaining the three-dimensional image, a three-dimensional image can be obtained in such a manner that cross-sections of the sintered material are taken as described above according to the FIB-SEM method using a "Helios 660" (produced by FEI), and a three-dimensional image is reconstructed using the obtained SEM images with the above-mentioned software. The three-dimensional image can be reconstructed using, for example, software such as "AVIZO" (produced by FEI).

The kurtosis A of the volume distribution of the base portion 1 (which hereinafter may be simply referred to as "kurtosis A") can be measured based on the obtained three-dimensional image by the following procedure.

First, the three-dimensional image of the sintered material obtained as described above is further equally divided into 125 (125 sections). For example, when the sintered material is a cube, the cube is further divided into 125 cubes (see FIG. 2(b) described later). The base portion 1, the buffer portions 2, and the filling portions 3 in each section obtained in this manner are observed, and the volumes thereof are measured. The volumes can be measured using, for example, "AVIZO" (produced by FEI).

The volume distribution is prepared based on the volume of the base portion 1 in each of the 125 sections, and the kurtosis A is calculated from the volume distribution. The volume distribution and the kurtosis A can be calculated using commercially available computational software, such as "Excel 2013" (produced by Microsoft).

In the above manner, the kurtosis (kurtosis A) of the volume distribution of the base portion 1 in a three-dimensional image of the sintered material can be measured.

In the Japanese Industrial Standards (JIS), the kurtosis is defined as $\mu_4/\sigma^4$, which is the ratio of the fourth moment about the mean ($\mu_4$) to the fourth power of the standard deviation ($\sigma$). The kurtosis is an indicator that indicates the probability density function for a random variable and the sharpness of a frequency distribution. The larger the kurtosis, the sharper the peak and the longer and fatter the tails, as compared to a normal distribution. The smaller the kurtosis, the rounder the peak and the shorter and thinner the tails, as compared to a normal distribution.

Since the base portion 1, the buffer portions 2, and the filling portions 3 are individually formed from different components, the base portion 1, the buffer portions 2, and the filling portions 3 individually appear on a three-dimensional image of the sintered material with different contrasting patterns. Thus, the base portion 1, the buffer portions 2, and the filling portions 3 in a three-dimensional image can be easily distinguished by confirming beforehand what contrasting patterns the components constituting the base portion 1, the buffer portions 2, and the filling portions 3 impart in the three-dimensional image.

The kurtosis B of the volume distribution of the base portion 1 in a three-dimensional image of the sintered material from which the fil Ung portions 3 are removed (which hereinafter may be simply referred to as "kurtosis B") can also be measured based on the three-dimensional image.

As used herein, "the sintered material from which the filling portions 3 are removed" means the sintered material for measuring the kurtosis A from. which only the filling portions 3 are removed. Thus, the sintered material for measuring the kurtosis B is the same as the sintered material for measuring the kurtosis A, except for the absence of the filling portions 3.

The kurtosis B can be measured in the same manner as in the procedure for measuring the kurtosis A. Specifically, a three-dimensional image of the sintered material is obtained and divided into 125 sections, and the kurtosis B of the base portion 1 can be measured from the volume distribution of the base portion 1 in each section.

In the sintered material of the present invention, the kurtosis A is larger than the kurtosis B. This means that the volume distribution of the base portion 1 is more uniform in the sintered material comprising the filling portions 3 than in the sintered material that does not comprise the filling portions 3. That is, in the sintered material comprising the filling portions 3, the volume distribution of the base portion 1 is more uniform than in the sintered material that does not comprise the filling portions 3; further, the buffer portions 2 are monodisperse in size.

Conventionally, no attention has been paid to the volume distribution of the base portion 1 (sintered body) and the distribution of the buffer portions 2 typified by defects such as pores, in order to investigate the characteristics of sintered materials. However, the present inventors focused on these volume distributions and found that when these portions are formed more uniformly, the thermal stress relief effect and bonding strength of the sintered material are both excellent.

Further, the present inventors found that chemical bonding between the base portion and the filling portions enables a thermal stress relief effect to be easily achieved.

As used herein, the bonding strength of the sintered material means the adhesion strength between the sintered material and a member to be bonded when the sintered material is used for bonding a target member such as a semiconductor element.

In the present invention, the filling portions 3 dispersed in the sintered body (base portion 1) and formed from a specific material are believed to disperse the buffer portions 2 in a uniform volume distribution. That is, the filling portions 3 are believed to have an effect of regulating the distribution of the buffer portions 2.

In the sintered material of the first embodiment, the difference between the kurtosis A and the kurtosis B (the value of A−B) is 0.1 or more, and particularly preferably 0.2 or more. In this case, the sintered material has both a more excellent thermal stress relief effect, and more excellent bonding strength.

In the sintered material of the second embodiment, the value of the kurtosis A is 0.2 or more, preferably 0.3 or more, more preferably 0.4 or more, and particularly preferably 0.5 or more. In this case, the sintered material is more excellent in terms of both the thermal stress and the bonding strength. The upper limit of the value of the kurtosis A is preferably as large as possible, and is generally 125.

The content of the filling portions 3 in the sintered material of the present invention is preferably 0.01 wt % or more and 10 wt % or less, based on the total weight of the sintered material. In this case, the kurtosis A is likely to be increased, and the sintered material has both a more excellent thermal stress relief effect, and more excellent bonding strength. The content of the filling portions 3 is more preferably 5 wt % or less, based on the total weight of the sintered material.

The closest distance between the filling portions 3 in the sintered material of the present invention is preferably 1 μm or more, and 10 μm or less. In this case, the kurtosis A can be further increased, and the sintered material has both an even more excellent thermal stress relief effect, and even more excellent bonding strength.

The closest distance between the filling portions 3 can be measured in such a manner that 50 pairs of adjacent filling portions 3 are selected from a three-dimensional image obtained by the same method as described above; the distance between the outermost layers of each pair is measured; 10 pairs of these pairs are selected in ascending order of distance; and the distances in the 10 pairs are averaged.

For example, "AVIZO" (produced by FEI) can be used to measure the distance between the outermost layers of each pair of filling portions 3.

In the sintered material of the present invention, the base portion 1 is preferably present so that the base portion 1 is distributed to be oriented in a one-dimensional direction. In this case, the sintered material is more excellent in both a thermal stress relief effect and bonding strength, and has advantages such that the thermal stress relief effect and bonding strength in a direction perpendicular to the one-dimensional direction can also be easily improved. The direction perpendicular to the one-dimensional direction refers to, for example, a direction perpendicular to one direction on a plane of the sintered material.

The type of the metal sintered body that forms the base portion 1 is not particularly limited. As the metal that forms the sintered body, known metals used for forming sintered bodies are usable. The metal is, for example, at least one member selected from the group consisting of gold, silver, tin, copper, germanium, indium, palladium, tellurium, thallium, bismuth, zinc, arsenic, selenium, and alloys containing at least one of these metallic elements. The sintered body preferably contains at least one member selected from the group consisting of gold, silver, and copper, among these metallic elements. In this case, the buffer portions 2 can be easily dispersed more uniformly.

When the buffer portions 2 are formed from a material that is not the same as that of the sintered body, the type of the material thereof is not particularly limited. Examples of the material that forms the buffer portions 2 include metals, resins, organic materials, inorganic materials, glass, ceramics, and the like. When the buffer portions 2 are formed from metal, the metal means a type of metallic element different from the type of metal constituting the sintered body. As the material of the buffer portions 2, resins, organic materials (except for resins), inorganic materials, glass, ceramics, etc., are preferable.

In terms of ease of production of the sintered material and reduction in weight of the sintered material, the buffer portions 2 are preferably formed from pores.

When the filling portions 3 are formed from particles, the type of particles are not particularly limited. Examples of the particles include resin particles, inorganic particles except for metal particles, organic-inorganic hybrid particles, metal particles, and the like.

In particular, the filling portions 3 are preferably formed from a composite having a structure in which a colloid catalyst or a sintering accelerator is placed on a base material, or a composite having a structure in which a base material is coated with a metal portion. Further, the base material is preferably a particle. In this case, the composite can be referred to as a "composite particle." When the base material is a particle, it is referred to as a "base particle."

When the filling portions 3 are formed from the composite, the presence of the colloid catalyst, sintering accelerator, or metal portion on the surface of the composite enhances affinity between the filling portions 3 and the base portion 1 (sintered body), in particular, allows chemical bonding between the filling portions 3 and the base portion 1 (sintered body) to easily occur. The filling portions 3 can thereby be easily dispersed in the sintered material more uniformly. As a result, the buffer portions 2 can also be easily dispersed (monodispersed) in the sintered material uniformly, the kurtosis A increases, and both the thermal stress relief effect and bonding strength of the sintered material can be especially improved. Since the affinity between the filling portions 3 and the base portion 1 is enhanced, the area of contact of the filling portions 3 with the base portion 1 is increased. This results in less formation of voids between the filling portions 3 and the base portion 1; and improvements in, in particular, both the thermal stress relief effect and bonding strength of the sintered material. The composite is particularly preferably a composite particle.

Example of the base material include resins, inorganic materials except for metals, organic-inorganic hybrid resins, and the like. When the base material is the base particle described above, examples include resin particles, inorganic particles except for metal particles, organic-inorganic hybrid particles, metal particles, and the like. The base particle is preferably a resin particle, inorganic particle except for metal particles, or organic-inorganic hybrid particle.

When the base material or base particle is a resin, various organic materials can be suitably used. Examples of such materials include polyolefin resins, such as polyethylene, polypropylene, polystyrene, silicone resin, polyvinyl chloride, polyvinylidene chloride, polyisobutylene, and polybutadiene; acrylic resins, such as polymethylmethacrylate and polymethylacrylate; polyalkylene terephthalate, polysulfone, polycarbonate, polyamide, phenol formaldehyde resin, melamine formaldehyde resin, benzoguanamine formaldehyde resin, urea formaldehyde resin, phenol resin, melamine resin, benzoguanamine resin, epoxy resin, saturated polyester resin, unsaturated polyester resin, polyphenylene oxide, polyacetal, polyimide, polyamide imide, polyether ether ketone, polyether sulfone, urea resin, and the like.

When the base material is a resin particle, it can be obtained by polymerizing one, or two or more of various polymerizable monomers having an ethylenically unsaturated group. In this case, resin particles having any physical properties can be designed and synthesized. Moreover, in this case, the hardness of the base particles can be easily controlled within a suitable range. From such a viewpoint, the material of the resin particles is preferably a polymer obtained by polymerizing one, or two or more polymerizable monomers having multiple ethylenically unsaturated groups.

When the resin particles are obtained by polymerizing one or more monomers having ethylenically unsaturated groups, non-crosslinkable monomers and/or crosslinkable monomers can be used as the monomer(s) having ethylenically unsaturated groups. In the following explanations, the term "(meth)acrylic" means either "acrylic" or "methacrylic," or both; and the term "(meth)acrylate" means either "acrylate" or "methacrylate," or both.

The non-crosslinkable monomers are specifically as follows. Examples of vinyl compounds include styrene-based monomers, such as styrene, α-methylstyrene, and chlorostyrene; vinyl ethers, such as methyl vinyl ether, ethyl vinyl ether, propyl vinyl ether, 1,4-butanediol divinyl ether, cyclohexanedimethanol divinyl ether, and diethylene glycol divinyl ether; acid vinyl esters, such as vinyl acetate, vinyl butyrate, vinyl laurate, and vinyl stearate; and halogen-containing monomers, such as vinyl chloride and vinyl fluoride. Examples of (meth)acrylic compounds include alkyl (meth)acrylates, such as methyl (meth)acrylate, ethyl (meth)acrylate, propyl (meth)acrylate, butyl (meth)acrylate, 2-ethylhexyl (meth)acrylate, lauryl (meth)acrylate, cetyl (meth)acrylate, stearyl (meth)acrylate, cyclohexyl (meth)acrylate, and isobornyl (meth)acrylate; oxygen atom-containing (meth)acrylates, such as 2-hydroxyethyl (meth)acrylate, glycerol (meth)acrylate, polyoxyethylene (meth)acrylate, and glycidyl (meth)acrylate; nitrile-containing monomers, such as (meth)acrylonitrile; and halogen-containing (meth)acrylates, such as trifluoromethyl (meth)acrylate and pentafluoroethyl (meth)acrylate. Examples of α-olefin compounds include olefins, such as diisobutylene, isobutylene, Linealene, ethylene, and propylene. Examples of conjugated diene compounds include isoprene and butadiene.

The crosslinkable monomers are specifically as follows. Examples of vinyl compounds include vinyl-based monomers, such as divinylbenzene, 1,4-divinyloxybutane, and divinylsulfone. Examples of (meth)acrylic compounds include polyfunctional (meth)acrylates, such as tetramethylolmethane tetra(meth)acrylate, tetramethylolmethane tri(meth)acrylate, tetramethylolmethane di(meth)acrylate, trimethylolpropane tri(meth)acrylate, dipentaerythritol hexa(meth)acrylate, dipentaerythritol penta(meth)acrylate, glycerol tri(meth)acrylate, glycerol di(meth)acrylate, (poly)ethylene glycol di(meth)acrylate, (poly)propylene glycol di(meth)acrylate, (poly)tetramethylene glycol di(meth)acrylate, and 1,4-butanediol di(meth)acrylate. Examples of allyl compounds include triallyl (iso)cyanurate, triallyl trimellitate, diallyl phthalate, diallyl acrylamide, and diallyl ether. Examples of silicone compounds include silane alkoxides, such as tetramethoxysilane, tetraethoxysilane, triethylsilane, t-butyldimethylsilane, methyltrimethoxysilane, methyltriethoxysilane, ethyltrimethoxysilane, ethyltriethoxysilane, isopropyltrimethoxysilane, isobutyltrimethoxysilane, cyclohexyltrimethoxysilane, n-hexyltrimethoxysilane, n-octyltriethoxysilane, n-decyltrimethoxysilane, phenyltrimethoxysilane, dimethyldimethoxysilane, dimethyldiethoxysilane, diisopropyldimethoxysilane, trimethoxysilylstyrene, γ-(meth)acryloxypropyltrimethoxysilane, 1,3-divinyltetramethyldisiloxane, methylphenyldimethoxysilane, and diphenyldimethoxysilane; polymerizable double bond-containing silane alkoxides, such as vinyltrimethoxysilane, vinyltriethoxysilane, dimethoxymethylvinyisilane, dimethoxyethylvinylsilane, diethoxymethylvinylsilane, diethoxyethylvinylsilane, ethylmethyldivinylsilane, methylvinyldimethoxysilane, ethylvinyldimethoxysilane, methylvinyldiethoxysilane, ethylvinyldiethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, and 3-acryloxyprophyltrimethoxysilane; cyclic siloxanes, such as decamethylcyclopentasiloxane; modified (reactive) silicone oils, such as one-end modified silicone oil, both-end silicone oil, and side-chain silicone oil; and carboxyl group-containing monomers, such as (meth)acrylic acid, maleic acid, and maleic anhydride.

The crosslinkable and non-crosslinkable monomers are not limited to the monomers listed above. Other polymerizable monomers, such as known polymerizable monomers, can also be used.

The resin particles can be obtained by polymerizing one or more polymerizable monomers having ethylenically unsaturated groups mentioned above by a known method. Examples of the method include a method in which suspension polymerization is performed in the presence of a radical polymerization initiator, a method in which a monomer is swollen and polymerized together with a radical polymerization initiator using non-crosslinked seed particles ("seed polymerization method"), and the like. The conditions for these polymerization methods are not particularly limited, and known conditions can be used.

When the base material is an inorganic or organic-inorganic hybrid resin except for metal particles, examples of the inorganic material as the material of the base material include silica/carbon black, and the like. It is preferable that this inorganic material is not metal. The silica is not particularly limited, and examples include particles obtained by hydrolyzing a silicon compound having two or more hydrolyzable alkoxysilyl groups to form crosslinked polymer particles, optionally followed by firing. Examples of the organic-inorganic hybrid resin include organic-inorganic hybrid particles formed of a crosslinked alkoxysilyl polymer and an acrylic resin. When the base material is a base particle, the base particle may be an inorganic particle except for metal particles or an organic-inorganic hybrid resin particle.

Other examples of the material of the base material include resins containing polyrotaxane. Polyrotaxane refers to a structure in which a chain polymer penetrates the openings of cyclic molecules. The type of polyrotaxane is not particularly limited. For example, known polyrotaxane can be used. When the base material is a base particle, the base particle may be a particle containing polyrotaxane.

When the material that constitutes the base material is a resin containing polyrotaxane, the polyrotaxane is preferably a crosslinked body. Specifically, in a preferable structure, the cyclic molecules in the polyrotaxane and the cyclic molecules in another polyrotaxane are crosslinked through a polymer chain. Such crosslinked polyrotaxane can increase the flexibility of the base material; thus, a stress relief effect can be easily exhibited. Therefore, when the sintered material is applied to a connection structure, the formation of cracks and warping in the connection structure can be easily suppressed. The type of such crosslinked polyrotaxane is not particularly limited. For example, known crosslinked polyrotaxane can be used.

The polyrotaxane can be produced by, for example, a known method. For example, polyrotaxane having a crosslinked structure can be produced by the reaction of a mixture of polyrotaxane having cyclic molecules having a polymerizable functional group, and a polymerizable monomer. This reaction can be performed by a known method, for example.

The type of polyrotaxane with cyclic molecules having a polymerizable functional group is not particularly limited. Specific examples include "SeRM (registered trademark) Super Polymer SM3405P," "SeRM (registered trademark) Key-Mixture SM3400C," "SeRM (registered trademark) Super Polymer SA3405P," "SeRM (registered trademark) Super Polymer SA2405P," "SeRM (registered trademark) Key-Mixture SA3400C," "SeRM (registered trademark) Key-Mixture SA2400C," "SeRM (registered trademark) Super Polymer SA3405P," and "SeRM (registered trademark) Super Polymer SA2405P," all of which are commercially available from Advanced Softmaterials Inc.

In terms of, for example, ensuring excellent dispersibility of the filling portions 3 in the sintered material, the average particle diameter of the base particles may be 0.1 μm or more, and 50 or less. The average particle diameter of the base particles is preferably 1 μm or more, and more preferably 3 μm or more. Moreover, the average particle diameter of the base particles is preferably 50 μm or less, and more preferably 10 μm or less.

The average particle diameter of the base particles having a. spherical shape means the diameter, and the average particle diameter of the base particles having a shape other than a spherical shape means the average value of the maximum diameter and the minimum diameter. The average particle diameter of the base particles means an average value obtained in such a manner that the base particles are observed with a scanning electron microscope, and the particle diameter of 50 individual base particles selected at random is measured by a caliper. The average particle diameter of base particles coated with another material as described above includes the coating layer.

The coefficient of variation (CV value) of the particle diameter of the base particles is 50% or less, for example. The coefficient of variation (CV value) is represented by the following formula:

$$CV \text{ value } (\%) = (\rho/Dn) \times 100$$

ρ: particle diameter standard deviation of the particles
Dn: average of the particle diameters of the particles In terms of easily monodispersing the buffer portions 2, the CV value of the base particles is preferably 40% or less, and more preferably 30% or less. The lower limit of the CV value of the particle diameter of the base particles is not particularly limited. The CV value may be 0% or more, 5% or more, 7% or more, or 10% or more.

The hardness of the base particles may be, for example, 10 N/mm² or more, and 3000 N/mm² or less. In terms of easily improving both the thermal stress relief effect and bonding strength of the sintered material, the 10% K value is preferably 100 N/mm² or more, more preferably 1000 N/mm² or more; and is preferably 2500 N/mm² or less, and particularly preferably 2000 N/mm² or less.

The 10% K value as mentioned herein refers to compressive elastic modulus when the base particles are 10% compressed. The 10% K value can be measured in the following manner. First, using a micro-compression tester, the base particles are compressed by the edge surface of a smooth cylindrical indenter (made of diamond; diameter: 50 μm) at 25° C. under conditions in which a maximum test load of 20 mN is applied over a period of 60 seconds. The load value (N) and compression displacement (mm) at this time are measured. The compressive elastic modulus can be determined from the measured value using the following formula:

$$10\% \, K \text{ value } (N/mm^2) = (3/2^{1/2}) \cdot F \cdot S^{-3/2} \cdot R^{-1/2}$$

F: load value (N) when the particles are 10% compressed and deformed
S: compression displacement (mm) when the particles are 10% compressed and deformed
R: radius (mm) of the particles The micro-compression tester is, for example, a "Fischer Scope H-100" (produced by Fischer). The 30% K value can be calculated by determining each of the above parameters when the particles are 30% compressed and deformed.

Examples of the sintering accelerator or colloid catalyst include metal fine particles and a flux component.

Examples of the metal fine particles include fine particles of gold, silver, platinum, palladium, tin, copper, germanium, indium, palladium, zinc, indium, zinc, iridium, rhodium, ruthenium, and osmium; alloys thereof; and the like. As the metal fine particles, one kind of metal fine particles may be used, or two or more kinds of metal fine particles may be used.

Examples of the method for placing the metal fine particles on the surface of the base particles include the following (1) to (3):
(1) a method in which the metal fine particles are added to a dispersion of the base particles, and the metal fine particles are accumulated and attached to the surface of the base particles due to van der Waals force;
(2) a method in which the metal fine particles are added to a container in which the base particles are placed, and the metal fine particles are attached to the surface of the base particles by mechanical action, such as by rotation of the container; and
(3) a method in which metal nanocolloids are added to a dispersion of the base particles, and the metal nanocolloids are accumulated on the surface of the base particles through chemical bonding and then reduced with a reducing agent for metallization, thereby attaching the metal fine particles to the surface of the base particles.

In particular, the method (1) is preferable from the viewpoint of easily controlling the amount of the metal fine particles to be attached. Even when the base material is other than a base particle, the methods (1) to (3) above can be used.

The average particle diameter of the metal fine particles is preferably 1 nm or more, and more preferably 5 nm or more; and is preferably 1000 nm or less, more preferably 500 nm or less, and even more preferably 100 nm or less. When metal nanocolloids in the method (3) above are used for the formation of the metal fine particles, the average particle diameter is preferably 1 nm or more, and more preferably 5 nm or more; and is preferably 50 nm or less, more preferably 40 nm or less, and even more preferably 35 nm or less. When the particle diameter of the metal fine particles is equal to or greater than the above lower limit, and equal to or less than the above upper limit, the area of contact between the particles and the sintered body is increased. The diameter of each metal nanocolloid means the maximum diameter. The average diameter of the metal fine particles is determined by observing the metal fine particles with, for example, a transmission electron microscope, and averaging the maximum diameters of 100 metal fine particles selected at random.

Known fluxes, for example, can be used as the flux component. Examples include resin-based fluxes, organic fluxes, inorganic fluxes, and the like. Examples of resin-based fluxes include rosin that contains, as a main component, abietic acid, palustric acid, dehydroabietic acid, isopimaric acid, neoabietic acid, or pimaric acid. Examples of organic fluxes include aliphatic carboxylic acid and aromatic carboxylic acid. Examples of inorganic fluxes include halides such as ammonium bromide and ammonium chloride. These flux components may be used singly, or in a combination of two or more. The flux component on the base particles allows an oxide film on the surface of the sintered body to be removed in the sintering process, promotes a sintering reaction on the surface of the base particles, and increases the area of contact of the base particles with the sintered body.

When the composite is a base material coated with a metal portion, the type of the base material is as described in the case of the composite having a structure in which a colloid catalyst or sintering accelerator is placed on a base material. In this case, the base material may also be a base particle.

The metal portion is formed of a metal-containing material. Examples of the metal include gold, silver, tin, copper, copper, germanium, indium, palladium, tellurium, thallium, bismuth, zinc, arsenic, selenium, iron, lead, ruthenium, aluminum, cobalt, titanium, antimony, cadmium, silicon, nickel, chromium, platinum, rhodium, and the like. The metal portion may contain one, or two or more of these metals. Moreover, the metal portion may be an alloy of two or more of the metals listed above.

The metal portion may be formed, for example, into a layer so that it covers the base material. In this case, the metal portion may be formed of one layer, or multiple layers.

The thickness of the metal portion may be, for example, 0.5 nm or more, and preferably 10 nm or more; and may be 10 μm or less, preferably 1 μm or less, more preferably 500 nm or less, and even more preferably 300 nm or less. When the thickness of the metal portion is equal to or greater than the above lower limit, and equal to or less than the above upper limit, the composite particles as the filling portions 3 can be easily dispersed in the base portion 1 more uniformly, and the buffer portions 2 can be dispersed more uniformly.

The method for forming the metal portion on the surface of the base particles is not particularly limited. Examples of the method for forming the metal portion include a method using electroless plating; a method using electroplating; a method using physical vapor deposition; and a method of coating paste containing metal powder, or metal powder and a binder, to the surface of the base particles. In terms of ease of formation of the metal portion, a method using electroless plating is preferable. Examples of the method using physical vapor deposition include vacuum deposition, ion plating, and ion sputtering.

When the metal portion has a multilayer structure, such a metal portion can also be formed in the same manner. For example, the above method for forming the metal portion is used to form a first metal portion on the surface of the base material, and to further form another layer on the surface of the first layer, thereby forming a metal portion having a multilayer structure.

The metal portion may have multiple protrusions on the outer surface thereof. The protrusions can be formed by, for example, a known method. The shape and size of the protrusions are not particularly limited. For example, the protrusions may be formed to have a spherical or elliptical cross-section, or may be formed in a needlelike shape sharpening toward the tip of the protrusions.

The average height of the protrusions can be 1 nm or more, and 1000 nm or less. The average height is preferably 5 nm or more and more preferably 50 nm or more; and is preferably 900 nm or less, and more preferably 500 nm or less. When. the average height of the protrusions is equal to or greater than the above lower limit, and equal to or less than. the above upper limit, the composite (e.g., composite particles) more easily comes into contact with the base portion 1, which is a sintered body.

The average height of the protrusions can be measured, for example, in the following manner. The composite (e.g., composite particles) is added to a "Technovit 4000" (produced by Kulzer) to a content of 30 wt %, and dispersed therein to produce an embedding resin for testing the composite. A cross-section of
the composite is cut with an ion milling system ("IM4000," produced by Hitachi High-Technologies Corp.) so that the cross-section passes near the center of the composite dispersed in the test embedding resin. Then, using a field emission scanning electron microscope (FE-SEM) at an image magnification of 50,000×, 20 composites are selected at random, and 50 protrusions of each composite are observed. The height from the bottom of the protrusion to the top of the protrusion is regarded as the height of the protrusion, and the measured heights are arithmetically averaged to obtain the average height of the protrusions.

The average diameter of the bottoms of the protrusions can be 3 nm or more, and 5000 nm or less. The average diameter is preferably 50 nm or more, and more preferably 80 nm or more; and is preferably 1000 nm or less, and more preferably 500 nm or less. The average diameter of the bottoms of the protrusions is a value obtained in such a manner that the protrusions of 20 composite particles selected at random are each observed with FE-SEM using an embedding resin by the same procedure as in the above method for measuring the average height of the protrusions, and the distance between both ends of each bottom portion is measured and arithmetically averaged.

The composite has a structure in which a colloid catalyst or sintering accelerator is placed on a part or all of the surface of a base material, or a structure in which a part or all of the surface of a base material is coated with a metal portion. When the composite is a composite particle, the composite particle has a structure in which a colloid catalyst or sintering accelerator is placed on a part or all of the surface of a base particle, or a structure in which a part or all of the surface of a base material is coated with a metal portion.

In another embodiment, the composite particles may comprise base particles having recesses, and a colloid catalyst or metal portion on the surface of the base particles. In the composite particles according to this embodiment, the colloid catalyst or metal portion can also cover the recesses.

The method for preparing the base particles having recesses is not particularly limited. For example, the base particles can be subjected to post-treatment to thereby form recesses in the base particles. The method for forming recesses by post-treatment is not particularly limited. For example, a known method can be used. Specific examples include a method of etching the surface of the base particles; a method of performing plasma treatment, ozone treatment, and heat-treatment in an oxygen atmosphere; a method of performing humidifying treatment; a method of performing heat-treatment under vacuum, a method of performing heat-treatment under pressure and humid conditions; a method of performing a wet process using an oxidant; and a method of performing physical treatment using a ball mill or the like.

The average depth of the recesses is not particularly limited. For example, the average depth of the recesses may be 0.1% or more, and 80% or less of the average radius of the base particles. The depth of the recess mentioned herein refers to the distance from the surface of the spherical base particle to the bottom-most point of the recess when the base particle having the a recesses is regarded as a spherical shape. Specifically, the average depth is a value obtained in such a manner that the protrusions of 20 composite particles selected at random are each observed with FE-SEM using an embedding resin by the same procedure as in the above method for measuring the average height of the protrusions, and the depth of each recess is arithmetically averaged.

When the composite particles have recesses, the composite particles can easily follow deformation. As a result, the thermal stress relief effect and bonding strength of the sintered material are further improved.

The shape of the particles for forming the filling portions 3 is not particularly limited. The particles are of any shape, for example, spherical, elliptical, amorphous, needle-shaped, rod-shaped, plate-shaped, scale-shaped, or the like. In terms of easily dispersing the filling portions 3 in the base portion 1 uniformly, the shape of the particles s preferably spherical or elliptical. Moreover, from the viewpoint of easily distributing the base portion 1 to be oriented in a specific one-dimensional direction as described above, the shape of the particles is preferably needle-shaped, rod-shaped, or plate-shaped.

For example, from the viewpoint of ensuring dispersibility of the filling portions 3 in the base portion 1, which is a sintered body, the average particle diameter of the particles forming the filling portions 3 may be 0.1 µm or more, and 50 µm or less. The average particle diameter of the particles is preferably 1 µm or more, and more preferably 3 µm or more; and is preferably 10 µm or less.

When the filling portions 3 are formed of fibers, the type of the fibers is not particularly limited. Examples of the fibers include natural fibers, synthetic fibers, glass fibers, carbon fibers, and rock fibers. Examples of the natural fibers include cellulose, silk, cotton, wool, and hemp. Examples of the synthetic fibers include polyesters (e.g., polyethylene terephthalate), polyamides, polyimides, acrylics, polyolefins, polymethylpentene, polyarylates, polyacetals, polyphenylene oxide, polysulfones, polyether ether ketone, and polyphenylene sulfide.

The method for producing the sintered material having the above structure is not particularly limited. For example, the sintered material can be produced by a known method.

For example, a composition for bonding comprising a metal for forming the base portion 1, a material for forming the buffer portions 2, and particles and/or fibers for forming the filling portions 3 is used as a raw material for sintering; and the composition for bonding is sintered, thereby obtaining a sintered material. When the sintered material in which the buffer portions 2 are formed from only pores is obtained, the composition for bonding does not contain the below-mentioned second raw material. Hereinafter, the metal for forming the base portion 1 is referred to as a "first raw material," the material for forming the buffer portions 2 is referred to as a "second raw material," and the particles and/or fibers for forming the filling portions 3 are referred to as a "third raw material."

The first ram material is not particularly limited, as long as it is a metal raw material from which the sintered body of the base portion 1 can be formed. For example, the first raw material may be metal particles. The metal particles may be particles of metal only, or particles of a metallic compound. The metallic compound is a compound containing a metal atom and an atom other than the metal atom.

Specific examples of the metallic compound include metal oxides, carbonates of metals, carboxylates of metals, complexes of metals, and the like. The metallic compound is preferably a metal oxide. For example, the metal oxide is sintered after being formed into metal particles by heating at the time of connection in the presence of a reducing agent. The metal oxide is a precursor of metal particles. Examples of particles of carboxylates of metals include particles of acetates of metals, and the like.

The metal of the first raw material is, for example, at least one member selected from the group consisting of gold, silver, tin, copper, germanium, indium, palladium, tellurium, thallium, bismuth, zinc, arsenic, selenium, and alloys containing at least one of these metallic elements.

When the first raw material is in the form of particles, the average particle diameter may be 10 nm or more, and 10 μm or less. Moreover, the first raw material may contain two or more kinds of particles having different average particle diameters. In this case, the bonding strength of the sintered material can be improved. For example, the average particle diameter of metal particles having a smaller average particle diameter may be 10 nm or more, and 100 nm or less, and the average particle diameter of metal particles having a larger average particle diameter may be 1 μm or more, and 10 μm or less. The ratio of the amount of the first raw material having a larger average particle diameter to the amount of the first raw material having a smaller average particle diameter may be 1/9 or more, and 9 or less. The average particle diameter is determined by observing the metal particles with a scanning electron microscope, and arithmetically averaging the maximum diameters of 50 particles randomly selected in the observed image.

When the first raw material is metal oxide particles, a reducing agent may be used in combination As the reducing agent, a known reducing agent may be used. The content of the reducing agent is preferably 1 part by weight or more, and more preferably 10 parts by weight or more; and is preferably 1000 parts by weight or less, more preferably 500 parts by weight or less, and even more preferably 100 parts by weight or less, based on 100 parts by weight of the first raw material. When the content of the reducing agent is equal to or greater than the above lower limit, a dense sintered body can be easily obtained.

The first raw material may contain other components as necessary. Examples of the other components include thermoplastic resins and curable resins. Examples of the curable resins include known photocurable resins and thermosetting resins. The photocurable resins may include photocurable resins and photopolymerization initiators. The thermosetting resins may include known thermosetting resins and heat-curing agents.

The first ram material may contain a dispersion medium. Examples of the dispersion medium include known solvents and the like.

The first raw material may be a commercially available product. Specific examples include "CT2700" (produced by Kyocera Chemical Corporation); "ASP295," "ASP016," and "ASP043" (produced by Heraeus); "LOCTITE ABLESTIK 5SP2020" (produced by Henkel); "H9890-6A" (produced by Namics Corporation.); "NH-4000," "NH-225)," and "NH-3000D" (produced by Harima Chemicals Group, Inc.); "CM-3212" and "CR-3520" (produced by Kaken Tech Co., Ltd.); "Alconano Ag Paste ANP-1" (produced by Nihon Superior Co., Ltd.); and the like.

The first raw material preferably has a property of being sintered by heating at a temperature of less than 400° C., more preferably 350° C. or less, and preferably 300° C. or more. When the sintering temperature for the first raw material is equal to or less than the above upper limit, sintering can be performed efficiently; further, the energy required for sintering can be reduced, and the environmental burden can also be reduced.

One kind of the first raw material may be used, or two or more kinds of the first raw material may be used in combination.

When the buffer portions 2 are not formed from pores, the second raw material is used. The second raw material may be a material that is not the same as the first raw material. The second raw material is the same as the above-mentioned material for forming the buffer portions 2. When the second raw material is a metal, the metal of the first raw material means a type of metallic element different from the type of metal contained in the second raw material.

The third ram material is the same as the above-mentioned particles and/or fibers for forming the filling portions 3.

The third raw material preferably contains the composite described above. In this case, the affinity of the filling portions 3 with the base portion 1, which is a sintered body, in the resulting sintered material is enhanced, and the filling portions 3 can thus be easily dispersed in the sintered material more uniformly. As a result, the buffer portions 2 can also be easily dispersed (monodispersed) in the sintered material uniformly; the kurtosis A is increased; and, in particular, both the thermal stress relief effect and bonding strength of the sintered material can be improved. As the composite, composite particles are more preferable.

One kind of the third raw material may be used, or two or more kinds of the third raw material may be used in combination.

In the composition for bonding (raw material for sintering), the mixing ratio of the first raw material, the second raw material, and the third raw material is not particularly limited. For example, when a sintered material is formed using the composition for bonding, the content of the first raw material, the second raw material, and the third ram material is preferably adjusted so that the content of the filling portions is 0.01 wt % or more, and 10 wt % or less. The composition for bonding may contain other materials as long as the effects of the present invention are not impaired. The composition for bonding may also consist of the first raw material, the second raw material, and the third raw material.

The method for sintering the composition for bonding is not particularly limited. The sintering temperature may be 100° C. or more, and 400° C. or less. As described later, when sintering is performed under increased pressure, the sintering temperature is preferably 150° C. or more, and 350° C. or less. When sintering is not performed under increased pressure, the sintering temperature is preferably 200° C. or more, and 350° C. or less.

The sintering time may be, for example, 30 seconds or more, and 7200 seconds or less. As described later, when sintering is performed under increased pressure, the sintering time is preferably 180 seconds or more, and 600 seconds or less. When sintering is not performed under increased pressure, the sintering time is preferably 180 seconds or more, and 5400 seconds or less. The sintering time may be adjusted according to the sintering temperature. For example, shortening the sintering time by performing sintering at a higher temperature increases production efficiency.

Sintering may be performed under increased pressure. In this case, the pressure may be 0.1 to 20 MPa.

Sintering may be performed under an air atmosphere, or under an atmosphere of an inert gas, such as nitrogen.

From the viewpoint of facilitating observation of the above-mentioned three-dimensional image, it is preferable that sintexing is performed in a state in which the composition for bonding is applied to a metal plate. Examples of the metal plate include copper substrates and the like. The application method is, for example, screen printing. Another metal plate may be placed on the surface of the composition for bonding applied by screen printing, and sintering may be performed in a state in which the composition for bonding is sandwiched between the metal plates.

In the process of forming a sintered body (base portion 1) by sintering the composition for bonding, the presence of the third raw material (i.e., a raw material for the filling portions 3) makes the buffer portions 2 (e.g., pores) less likely to be unevenly distributed in the sintered body, and makes it easy to disperse the buffer portions 2 uniformly. This enables the buffer portions 2 to be monodispersed, adjusts the volume distribution of the base portion 1 to an appropriate range, and results in an increased kurtosis A of the sintered material.

As described above, a sintered material can be obtained by the production method comprising the step of sintering the composition for bonding. The kurtosis A of the sintered material produced in this manner can be measured according to the procedure described above.

The sintered material for measuring the kurtosis B, i.e., the sintered material from which the filling portions 3 are removed (which hereinafter may be referred to as "blank sintered material") can be produced, for example, in the following manner.

The blank sintered material can be obtained by removing the third raw material from the composition for bonding, and sintering the composition. In this case, the types and amounts of the first raw material and second raw material, and the sintering conditions are the same as in the method for obtaining the sintered material for measuring the kurtosis A. Examples of the method for removing the third raw material include a method in which the composition for bonding is taken and observed with an optical microscope, and the third raw material is removed with a glass capillary; and a method in which the third raw material is removed by centrifugation. Alternatively, the blank sintered material can be obtained by sintering the composition for bonding that does not contain the third raw material in the above-mentioned method for producing the sintered material. In this case as well, the types and amounts of the first raw material and second raw material, and the sintering conditions are the same as in the method for obtaining the sintered material for measuring the kurtosis A.

The composition for bonding of the present invention preferably contain, in particular, the above-mentioned composite having a structure in which a colloid catalyst or a sintering accelerator is placed on a base material or composite having a structure in which a base material is coated with a metal portion, and metal particles. That is, in the composition for bonding, it is preferable that the first raw material contains the metal particles described above, and that the third raw material contains the composite. In this case, the buffer portions 2 can be easily monodispersed, the volume distribution of the base portion 1 can be easily adjusted to an appropriate range, and the kurtosis A of the sintered material is increased. In a preferred embodiment, the first raw material, the third raw material, the mixing ratio thereof, etc., are as described above.

A sintered material formed by sintering the composition for bonding of the present invention can satisfy A>B. Alternatively, in such a sintered material of the composition for bonding, the value of A can be 0.2 or more. As a result, the sintered material is excellent in both a thermal stress relief effect and bonding strength; and is suitable, for example, as a bonding member for bonding a semiconductor element.

To confirm that the sintered material of the composition for bonding satisfies A>B or A≥0.2, the composition for bonding is sintered under the following conditions.

First, the composition for bonding is applied to a Cu substrate with a thickness of 1 mm to a thickness of 100 μm by screen printing, and another Cu substrate with a thickness of 1 mm is placed on the surface to sandwich the composition between the substrates. The composition for bonding sandwiched between the substrates is dried at 130° C. for 90 seconds in a nitrogen atmosphere and then heated at 300° C. for 3 minutes while applying a pressure of 5 MPa, thereby obtaining a sintered material. The value of A can be measured using this sintered material. The value of B can be measured in such a manner that the third raw material (composite) is removed from the composition for bonding by a method described above to prepare a composition for measuring the value of B, and the value of B is measured using the composition in the same manner as in the method for measuring the value of A.

The sintered material of the present invention is superior in both a thermal stress relief effect and bonding strength. Thus, the sintered material of the present invention can be used for a connection part of a connection structure. A connection structure comprising the sintered material of the present invention in a connection part is excellent in a thermal stress relief effect, and is thus a structure having excellent durability. In particular, since the connection part comprises a bonding member formed of the sintered material of the present invention, the bonding strength is also excellent.

The type of the connection structure is not particularly limited. Examples include various semiconductor devices (power devices). The connection structure may be, for example, similar to a known connection structure.

Moreover, the composite is particularly useful as an additive for forming the sintered material. This is because in the sintered material comprising the composite as the filling portions 3, the filling portions 3 can be easily dispersed in the sintered material, contributing to uniform dispersion (monodispersion) of the buffer portions 2. As the composite, composite particles are more preferable.

Thus, the composite is suitable as an additive for forming the filling portions of the sintered material (a distribution regulator for the buffer portions). That is, the composite (e.g., composite particles) is suitable for use in distributing the base portion 1 and the buffer portions 2, and is suitable for use in producing the sintered material.

Moreover, obtaining a sintered material using the composition for bonding containing the first raw material, the second raw material, and the third raw material is also suitable as a method for regulating the distribution state of the base portion 1 and the buffer portions 2 formed in the sintered material.

EXAMPLES

The present invention is described in more detail below with reference to Examples; however, the present invention is not limited to the embodiments of these Examples.

Example 1

Divinylbenzene copolymer resin particles having a particle diameter of 3.0 μm ("Micro Pearl SP-203," produced by Sekisui Chemical Co., Ltd.) were prepared as base particles.

After 10 parts by weight of the base particles A were dispersed in 100 parts by weight of alkali solution containing 5 wt % of palladium catalyst solution using an ultrasonic disperser, the solution was filtered to extract the base particles A. Subsequently, the base particles A were added to 100 parts by weight of dimethylamine borane 1 wt % solution to activate the surface of the base particles A. The base particles A with the activated surface were sufficiently washed with water, then added to 500 parts by weight of distilled water and dispersed therein, thereby obtaining a suspension (A).

The suspension (A) was placed in a solution containing 20 g/L of copper sulfate and 30 g/L of ethylenediaminetetraacetic acid to obtain a particle mixture liquid (B).

Further, as an electroless copper plating liquid, a copper plating liquid (C) was prepared by adjusting the pH of a mixture containing 250 g/L of copper sulfate, 150 g/L of ethylenediaminetetraacetic acid, 100 g/L of sodium gluconate, and 50 g/L of formaldehyde to 10.5 using ammonia.

Moreover, as an electroless silver plating liquid, a silver plating liquid (D) was prepared by adjusting the pH of a mixture containing 30 g/L of silver nitrate, 100 g/L of succinimide, and 20 g/L of formaldehyde to 8.0 using aqueous ammonia.

The copper plating liquid (C) was gradually added dropwise to the particle mixture liquid (B) in a dispersed state adjusted to 55° C., and electroless copper plating was performed. Electroless copper plating was performed under the following conditions: dropping rate of the copper plating liquid (C): 30 ml/min; dropping time: 30 minutes. Thus, a particle mixture liquid (E) containing particles having a copper metal portion as a first metal portion on the surface of resin particles was obtained.

Thereafter, the particle mixture liquid (E) was filtered to extract the particles, followed by water washing, thereby obtaining particles having a copper metal portion on the surface of the base particles A. The particles were sufficiently washed with water, then added to 500 parts by weight of distilled water and dispersed therein, thereby obtaining a particle mixture liquid (F).

Next, the silver plating liquid (D) was gradually added dropwise to the particle mixture liquid (F) in a dispersed state adjusted to 60° C., and electroless silver plating was performed. Electroless silver plating was performed under the following conditions: dropping rate of the silver plating liquid (C): 10 mL/min, and dropping time: 30 minutes. Thereafter, the particles were extracted by filtration, washed with water, and dried, thereby obtaining composite particles A having a metal portion containing copper and silver laminated in this order (thickness of the entire metal portion: 0.1 μm) on the surface of the base particles A.

0.98 g of a silver paste ("Alconano Ag Paste ANP-1" produced by Nihon Superior Co., Ltd.), which is the first raw material, and 0.02 g of the composite particles A were kneaded with a spatula so as to be well dispersed, thereby preparing a composition for bonding.

The kneaded composition for bonding was applied to a Cu substrate with a thickness of 1 mm to a thickness of 100 μm by screen printing, and another Cu substrate with a thickness of 1 mm was placed on the surface to sandwich the composition between the substrates. The composition for bonding sandwiched between the substrates was dried at 130° C. for 90 seconds in a nitrogen atmosphere and then heated at 300° C. for 3 minutes while applying a pressure of 5 MPa, thereby obtaining a sintered material. In the sintered material, the content of the composite particles was 2 wt %, and the closest distance between the composite particles was 3.52 μm.

Tomographic images of the obtained sintered material were taken with a Helios 660 (produced by FEI) by the FIB-SEM method, and a three-dimensional image of the sintered material was obtained by reconstruction using the images. The observation. conditions were as follows: the acceleration voltage: 2 kV; backscattered electron image; and sample tilt: 52°.

Figure 2A:
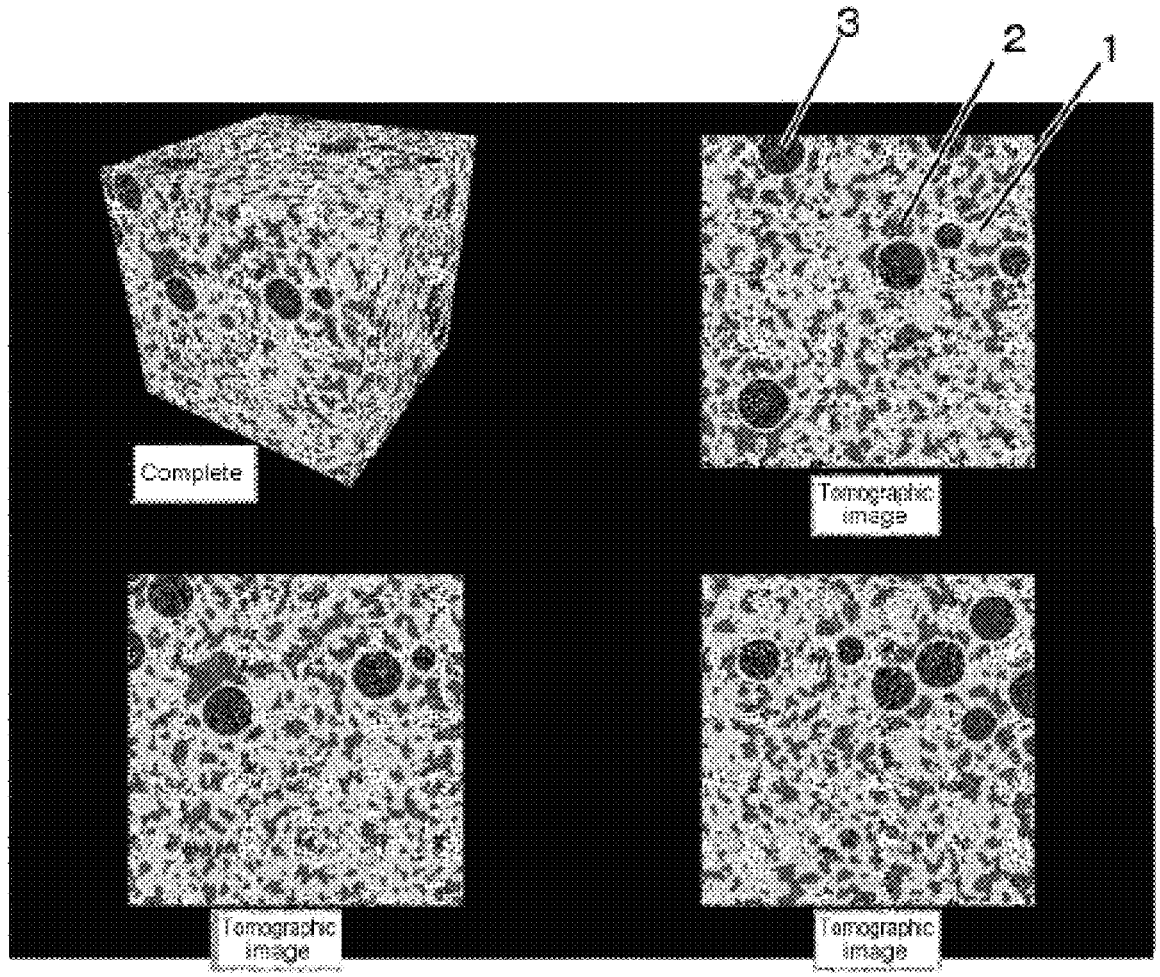
FIG. 2(a) shows a three-dimensional image obtained in Example 1.
Figure 2B:
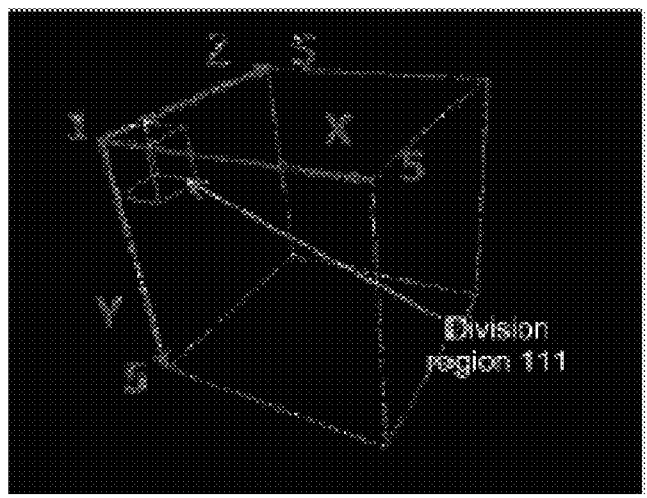
FIG. 2(b) is a diagram illustrating one of 125 sections into which the sintered material is divided.

FIG. 2(a) shows the three-dimensional image obtained in Example 1, and shows a complete image and three tomographic images (cross-sectional images). As shown in FIG. 2(b), the three-dimensional image of FIG. 2(a) is one of 125 sections into which the sintered material was divided.

As shown in FIG. 2(a), three different contrasting patterns were exhibited in the obtained sintered material, confirming the formation of the base portion 1, the buffer portions 2, and the filling portions 3. The base portion 1 is a sintered body of a silver paste (silver sintered body), and the filling portions 3 are composite particles. In this Example, the buffer portions 2 are formed from pores.

The volumes of the base portion 1, the buffer portions 2, and the filling portions 3 in each of the obtained 125 sections were calculated using "AVIZO" (produced by FEI), and volume distribution was prepared. The kurtosis A was calculated from this volume distribution, and was found to be 0.97.

A composition for bonding was prepared by removing the composite particles from the composition for bonding of Example 1, and used as a composition for bonding for measuring the kurtosis B.

The obtained composition for bonding for measuring kurtosis B was applied to a Cu substrate with a thickness of 1 mm to a thickness of 100 μm by screen printing, and another Cu substrate with a thickness of 1 mm was placed on the surface to sandwich the composition between the substrates. The composition for bonding sandwiched between the substrates was dried at 130° C. for 90 seconds in a nitrogen atmosphere and then heated at 300° C. for 3 minutes while applying a pressure of 5 MPa, thereby obtaining a sintered material. The kurtosis B of this sintered material was measured in the same manner as in the method for measuring the kurtosis A, and was found to be 0.52.

Evaluation of Thermal Stress Relief Effect and Bonding Strength

The thermal stress relief effect and the bonding strength were evaluated based on the "method for shear strength of solder joints" described in "JIS Z 3198-7: Test method for lead-free solders—Part 7: Method for shear strength of solder joints on chip components."

Figure 3:
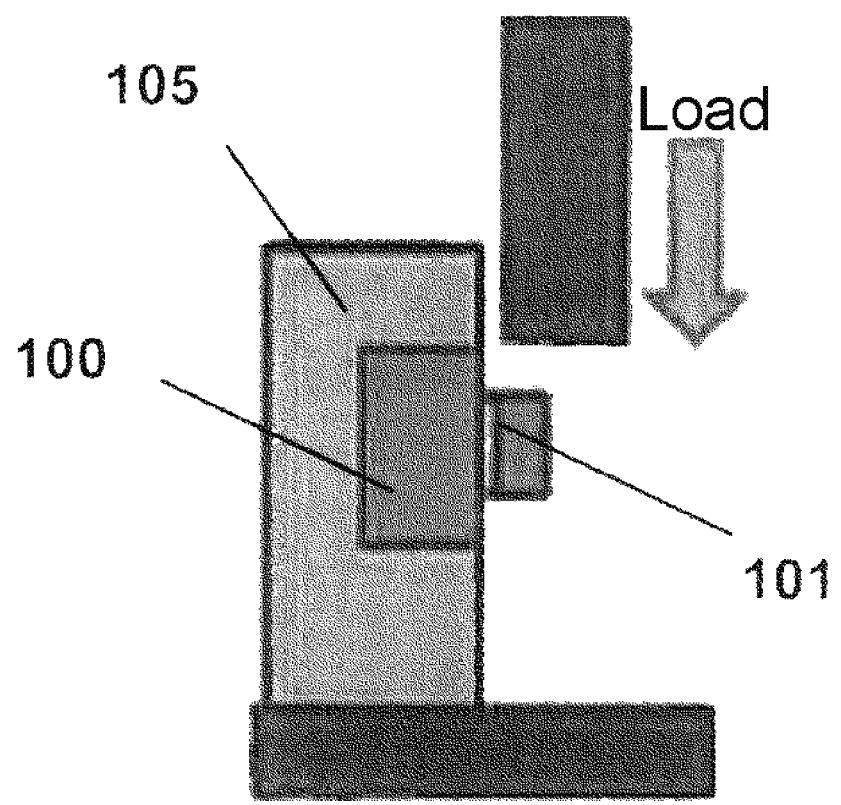
FIG. 3 is a schematic diagram of a measurement device for measuring a thermal stress relief effect and bonding strength.

FIG. 3 schematically illustrates a measurement device for measuring the thermal stress relief effect and the bonding strength in the measurement, cylindrical copper (diameter: 10 mm and thickness: 5 mm) was used as a substrate 100. Each of the compositions for bonding obtained in the Examples and Comparative Examples was individually applied to the substrate 100 to form a paste layer (diameter: 5 mm and thickness: 50 μm). A copper disk chip 101 (diameter: 5 mm and thickness: 2 mm) was disposed on the paste layer, and sintering was performed at 300° C. for 3 minutes while applying a pressure of 5 MPa to bond the substrate 100 and the chip 101 by means of the sintered material. This sample was set in a shear strength tester 105, and a load was applied to the chip 101 and the connection part at a shear rate of 6 mm/min. The relationship between displacement and load was graphed to obtain a stress-strain curve, and the work done by thermal stress and the bonding strength were measured. The work done by thermal stress can be measured by calculating an integral value from the start of displacement to the breaking point in the stress-strain curve, and indicates the amount of energy absorbed until break. The bonding strength is a stress value at break in the stress-strain curve.

Evaluation of the thermal stress relief effect and the bonding strength using the composition for bonding of Example 1 revealed that the work done by thermal stress was 0.988 J, and that the bonding strength was 85.04 MPa. The results showed that a thermal stress relief effect and bonding strength superior to those obtained using conventional compositions for bonding were imparted.

Example 2

A composition for bonding was prepared in the same manner as in Example 1, except that the amount of the silver paste, which is the first raw material, was changed to 0.99 g, and that the amount of the composite particles A was changed to 0.01 g. The content of the composite particles was 1 wt %. A sintered material was prepared using the obtained composition for bonding in the same manner as in Example 1, and the kurtosis A, kurtosis B, work done by thermal stress, elongation at break, and bonding strength of the sintered material were individually measured in the same manner as the methods described above.

Example 3

A composition for bonding was prepared in the same manner as in Example 1, except that the amount of the silver paste, which is the first raw material, was changed to 0.90 g, and that the amount of the composite particles A was changed to 0.10 g. The content of the composite particles was 10 wt %, A sintered material was prepared using the obtained composition for bonding in the same manner as in Example 1, and the kurtosis A, kurtosis B, work done by thermal stress, elongation at break, and bonding strength of the sintered material were individually measured in the same manner as the methods described above.

Example 4

A composition for bonding was prepared in the same manner as in Example 1, except that 0.98 g of resin-containing silver paste "CT2700" (produced by Kyocera Chemical Corporation) was used instead. of the silver paste, which is the first raw material The content of the composite particles was 2 wt %. The obtained composition for bonding was applied to a Cu substrate with a thickness of 1 mm to a thickness of 100 μm by screen printing, and another Cu substrate with a thickness of 1 mm was placed on the surface to sandwich the composition between the substrates. The composition for bonding sandwiched. between the substrates was heated at 200° C. for 90 minutes, thereby obtaining a sintered material. The kurtosis A, kurtosis B, work done by thermal stress, elongation at break, and bonding strength of the sintered material were individually measured in the same manner as the methods described above.

Example 5

A composition for bonding was prepared in the same manner as in Example 1, except that 0.02 g of "L-MWNT-4060" (produced by NTP) was used as fibers instead of the composite particles A. The content of the fibers was 2 wt %. A sintered material was prepared using the obtained composition. for bonding in the same manner as in Example 1, and the kurtosis A, kurtosis B, work done by thermal stress, elongation at break, and bonding strength of the sintered material were individually measured in the same manner as the methods described above.

Comparative Example 1

Only a silver paste ("Alconano Ag Paste ANP-1" produced by Nihon Superior Co., Ltd.), which is the first raw material, was used as a composition for bonding. A sintered material was prepared using the obtained composition for bonding in the same manner as in Example 1, and the kurtosis A, kurtosis B, work done by thermal stress, elongation at break, and bonding strength of the sintered material were individually measured in the same manner as the methods described above.

Comparative Example 2

Only a silver paste ("CT2700" produced by Kyocera Chemical Corporation), which is the first raw material, was used as a composition for bonding. A sintered material was prepared using the obtained composition for bonding in the seine manner as in Example 1, and the kurtosis A, kurtosis B, work done by thermal stress, elongation at break, and bonding strength of the sintered material were individually measured in the same manner as the methods described above.

Table 1 is a summary of the evaluation results of the kurtosis A, kurtosis B, work done by thermal stress, elongation at break, and bonding strength of the sintered materials prepared using the compositions for bonding obtained in the Examples and Comparative Examples.

TABLE 1

| Example/Comparative Example | Kurtosis A | Kurtosis B | Work done by thermal stress (J) | Elongation at break (%) | Bonding strength (MPa) |
|---|---|---|---|---|---|
| Example 1 | 0.97 | 0.52 | 0.988 | 35 | 85.04 |
| Example 2 | 0.74 | 0.49 | 0.632 | 28 | 67.01 |
| Example 3 | 0.28 | 0.17 | 0.550 | 26 | 53.30 |
| Example 4 | 0.33 | 0.11 | 0.591 | 33 | 45.32 |
| Example 5 | 0.81 | 0.45 | 0.801 | 29 | 82.11 |
| Comparative Example 1 | 0.01 | 0.03 | 0.207 | 18 | 42.00 |
| Comparative Example 2 | 0.06 | 0.09 | 0.229 | 31 | 28.21 |

Table 1 shows that even when any of the compositions for bonding of Examples 2 to 5 were used, a thermal stress relief effect and bonding strength (45 MPa or more in all of these Examples) superior to those obtained using conventional compositions for bonding were imparted.

In all of these Examples, a superior thermal stress relief effect and bonding strength were imparted. This is considered to be because the expression: A>B was satisfied; and further because the filling portions 3 (composite particles A or fibers) and the base portion 1 (silver sintered body) form chemical bonding (e.g., metallic binding).

DESCRIPTION OF THE REFERENCE NUMERALS

1: Base portion
2: Buffer portion
3: Filling portion

The invention claimed is:

1. A sintered material comprising
1) a base portion, the base portion being a metal sintered body,
2) one or more buffer portions, and
3) one or more filling portions,
wherein the one or more buffer portions and the one or more filling portions are dispersed in the base portion,
wherein each of the one or more buffer portions is formed from at least one of a pore and a material that is not the same as that of the metal sintered body,
wherein each of the one or more filling portions is formed from at least one of particles and fibers,
wherein the sintered material has a value of A that is 0.2 or more,
wherein A is a kurtosis of volume distribution of the base portion in a three-dimensional image of an entirety of the sintered material,
wherein each of the one or more filling portions is formed from a composite having a structure in which a colloid catalyst or a sintering accelerator is placed on base particles,
wherein the base particles are resin particles or organic-inorganic hybrid particles,
wherein the base particles have a 10% K value of 10 N/mm$^2$ or more and 3000 N/mm$^2$ or less, and
wherein the base particles have a coefficient of variation (CV value) of the particle diameter of 40% or less, and
wherein each of the one or more filing portions is present so that a part or all of the surface thereof is in contact with the base portion through chemical bonding.

2. The sintered material according to claim 1, wherein the content of the filling portions is 0.01 wt % or more and 10 wt % or less.

3. The sintered material according to claim 1, wherein the closest distance between the filling portions is 1 µm or more and 10 µm or less.

4. A connection structure comprising the sintered material according to claim 1 in a connection part.

* * * * *